United States Patent
Pandev

(10) Patent No.: US 11,415,898 B2
(45) Date of Patent: Aug. 16, 2022

(54) SIGNAL-DOMAIN ADAPTATION FOR METROLOGY

(71) Applicant: KLA Corporation, Milpitas, CA (US)

(72) Inventor: Stilian Pandev, Santa Clara, CA (US)

(73) Assignee: KLA Corporation, Milpltas, CA (US)

( * ) Notice: Subject to any disclaimer, the term of this patent is extended or adjusted under 35 U.S.C. 154(b) by 439 days.

(21) Appl. No.: 16/724,058

(22) Filed: Dec. 20, 2019

(65) Prior Publication Data

US 2021/0109453 A1    Apr. 15, 2021

Related U.S. Application Data

(60) Provisional application No. 62/914,621, filed on Oct. 14, 2019.

(51) Int. Cl.
*G03F 7/20* (2006.01)
*H01L 21/67* (2006.01)
*G01B 11/24* (2006.01)
*G06N 20/00* (2019.01)

(52) U.S. Cl.
CPC .......... *G03F 7/70625* (2013.01); *G01B 11/24* (2013.01); *G03F 7/705* (2013.01); *G06N 20/00* (2019.01); *H01L 21/67253* (2013.01)

(58) Field of Classification Search
USPC .......................................................... 706/12
See application file for complete search history.

(56) References Cited

U.S. PATENT DOCUMENTS

| | | | |
|---|---|---|---|
| 5,608,526 A | 3/1997 | Piwonka-Corle et al. | |
| 5,859,424 A | 1/1999 | Norton et al. | |
| 6,429,943 B1 | 8/2002 | Opsal et al. | |
| 7,478,019 B2 | 1/2009 | Zangooie et al. | |
| 7,933,026 B2 | 4/2011 | Opsal et al. | |

(Continued)

FOREIGN PATENT DOCUMENTS

JP    4914457 B2    4/2012

OTHER PUBLICATIONS

Jason Brownlee, "A Gentle Introduction to CycleGAN for Image Translation," Aug. 5, 2019, available at https://machinelearningmastery.com/what-is-cyclegan/ (downloaded Nov. 7, 2019).

(Continued)

*Primary Examiner* — Mohammed Alam
(74) *Attorney, Agent, or Firm* — Huse IP Law; Charles C. Huse

(57) ABSTRACT

First and second metrology data are used to train a machine-learning model to predict metrology data for a metrology target based on metrology data for a device area. The first metrology data are for a plurality of instances of a device area on semiconductor die fabricated using a fabrication process. The second metrology data are for a plurality of instances of a metrology target that contains structures distinct from structures in the device area. Using the trained machine-learning model, fourth metrology data are predicted for the metrology target based on third metrology data for an instance of the device area. Using a recipe for the metrology target, one or more parameters of the metrology target are determined based on the fourth metrology data. The fabrication process is monitored and controlled based at least in part on the one or more parameters.

25 Claims, 4 Drawing Sheets

(56) References Cited

U.S. PATENT DOCUMENTS

| | | | |
|---|---|---|---|
| 8,095,484 B2 | 1/2012 | Cheng et al. | |
| 9,291,554 B2 | 3/2016 | Kuznetsov et al. | |
| 9,581,430 B2 | 2/2017 | Manassen et al. | |
| 9,739,702 B2 | 8/2017 | Bringoltz et al. | |
| 9,915,522 B1 | 3/2018 | Jiang et al. | |
| 10,365,225 B1 | 7/2019 | Pandev et al. | |
| 2009/0198635 A1 | 8/2009 | Doddi et al. | |
| 2009/0248339 A1* | 10/2009 | Tian | G01N 21/956 702/82 |
| 2011/0245955 A1* | 10/2011 | Li | G01B 11/24 356/625 |
| 2014/0172394 A1 | 6/2014 | Kuznetsov et al. | |
| 2014/0297211 A1 | 10/2014 | Pandev et al. | |
| 2014/0316730 A1 | 10/2014 | Shchegrov et al. | |
| 2015/0046118 A1 | 2/2015 | Pandev et al. | |
| 2015/0323316 A1 | 11/2015 | Shchegrov et al. | |
| 2016/0109375 A1 | 4/2016 | Pandev et al. | |
| 2016/0266505 A1 | 9/2016 | Amit et al. | |
| 2016/0282105 A1 | 9/2016 | Pandev | |
| 2018/0350699 A1* | 12/2018 | Gellineau | H01L 21/67253 |
| 2019/0178630 A1* | 6/2019 | Amit | G06N 20/00 |
| 2021/0109453 A1* | 4/2021 | Pandev | G01B 21/02 |

OTHER PUBLICATIONS

PCT/US2020/054659, International Search Report, dated Feb. 1, 2021.

PCT/US2020/054659, Written Opinion of the International Searching Authority, dated Feb. 1, 2021.

\* cited by examiner

```
                              200 ─┐
```

┌─────────────────────────────────────────────────────────────────────────────┐
│ Obtain first metrology data for a plurality of instances of a device area on semiconductor die fabricated │
│ using a fabrication process. The device area contains semi-periodic or non-periodic structures. Obtain │
│ second metrology data for a plurality of instances of a metrology target. The metrology target contains │
│ structures distinct from the semi-periodic or non-periodic structures in the device area. (202) │
│ ┌─────────────────────────────────────────────────────────────────────────┐ │
│ │ The structures contained in the metrology target are periodic. (204) │ │
│ └─────────────────────────────────────────────────────────────────────────┘ │
│ ┌─────────────────────────────────────────────────────────────────────────┐ │
│ │ Obtain metrology data for a plurality of paired instances of the device area and the metrology target. │ │
│ │ (206) │ │
│ └─────────────────────────────────────────────────────────────────────────┘ │
│ ┌─────────────────────────────────────────────────────────────────────────┐ │
│ │ The plurality of instances of the device area are not paired with the plurality of instances of the │ │
│ │ metrology target. (208) │ │
│ └─────────────────────────────────────────────────────────────────────────┘ │
│ ┌─────────────────────────────────────────────────────────────────────────┐ │
│ │ The plurality of instances of the device area are situated on one or more full-loop semiconductor │ │
│ │ wafers. The plurality of instances of the metrology target are situated on one or more short-loop │ │
│ │ semiconductor wafers. (210) │ │
│ └─────────────────────────────────────────────────────────────────────────┘ │
│ ┌─────────────────────────────────────────────────────────────────────────┐ │
│ │ The plurality of instances of the device area are situated on one or more semiconductor wafer. The │ │
│ │ plurality of instances of the metrology target are simulated. (212) │ │
│ └─────────────────────────────────────────────────────────────────────────┘ │
└─────────────────────────────────────────────────────────────────────────────┘
                                      ↓
┌─────────────────────────────────────────────────────────────────────────────┐
│ Using the first and second metrology data, train a machine-learning model to predict metrology data for │
│ the metrology target based on metrology data for the device area. (214) │
└─────────────────────────────────────────────────────────────────────────────┘
                                      ↓
┌─────────────────────────────────────────────────────────────────────────────┐
│ Obtain third metrology data for an instance of the device area on a first semiconductor die that is distinct │
│ from the semiconductor die having the first plurality of instances of the device area. (216) │
└─────────────────────────────────────────────────────────────────────────────┘
                                      ↓
┌─────────────────────────────────────────────────────────────────────────────┐
│ Using the trained machine-learning model, predict fourth metrology data for the metrology target based │
│ on the third metrology data. (218) │
└─────────────────────────────────────────────────────────────────────────────┘
                                      ↓
┌─────────────────────────────────────────────────────────────────────────────┐
│ Using a recipe for the metrology target, determine one or more parameters of the metrology target │
│ based on the fourth metrology data. (220) │
│ ┌─────────────────────────────────────────────────────────────────────────┐ │
│ │ The one or more parameters are selected from the group consisting of CD, overlay, sidewall angle, │ │
│ │ edge-placement error, focus, and dose. (222) │ │
│ └─────────────────────────────────────────────────────────────────────────┘ │
└─────────────────────────────────────────────────────────────────────────────┘
                                      ↓
┌─────────────────────────────────────────────────────────────────────────────┐
│ Monitor and control the fabrication process based at least in part on the one or more parameters. (224) │
└─────────────────────────────────────────────────────────────────────────────┘

Figure 2

SIGNAL-DOMAIN ADAPTATION FOR METROLOGY

RELATED APPLICATION

This application claims priority to U.S. Provisional Patent Application No. 62/914,621, filed Oct. 14, 2019, which is hereby incorporated by reference in its entirety for all purposes.

TECHNICAL FIELD

This disclosure relates to semiconductor metrology, and more specifically to transforming metrology data to obtain parameter measurements for semiconductor structures.

BACKGROUND

Semiconductor metrology may be used to measure parameters (i.e., parameter values) of structures on a semiconductor wafer, by obtaining metrology data and processing the metrology data using a model of the structures. Complex structures, however, such as semi-periodic and non-periodic structures, are difficult or impossible to model. For example, optical critical-dimension (OCD) metrology works for periodic structures but not for complex non-periodic structures. Conventional regression-based modeling may fail for complex structures, and the use of machine learning to model complex structures may be ineffective. For example, reference data to be used for machine learning may be unavailable or may not include sufficient variation of structural parameters to produce a well-trained, accurate model that is robust with respect to process variation.

SUMMARY

Accordingly, there is a need for improved methods and systems of using metrology data to measure parameters of complex semiconductor structures.

In some embodiments, a method of performing semiconductor metrology is performed in a computer system that includes one or more processors and memory storing instructions for execution by the one or more processors. In the method, first metrology data are obtained for a plurality of instances of a device area on semiconductor die fabricated using a fabrication process. The device area contains semi-periodic or non-periodic structures. Second metrology data are obtained for a plurality of instances of a metrology target, wherein the metrology target contains structures distinct from the semi-periodic or non-periodic structures in the device area. Using the first and second metrology data, a machine-learning model is trained to predict metrology data for the metrology target based on metrology data for the device area. Third metrology data are obtained for an instance of the device area on a first semiconductor die that is distinct from the semiconductor die having the first plurality of instances of the device area. Using the trained machine-learning model, fourth metrology data are predicted for the metrology target based on the third metrology data. Using a recipe for the metrology target, one or more parameters of the metrology target are determined based on the fourth metrology data. The fabrication process is monitored and controlled based at least in part on the one or more parameters.

In some embodiments, a non-transitory computer-readable storage medium stores one or more programs for execution by one or more processors of a computer system. The one or more programs include instructions for using first and second metrology data to train a machine-learning model to predict metrology data for the metrology target based on metrology data for the device area. The first metrology data are for a plurality of instances of a device area on semiconductor die fabricated using a fabrication process. The device area contains semi-periodic or non-periodic structures. The second metrology data are for a plurality of instances of a metrology target. The metrology target contains structures distinct from the semi-periodic or non-periodic structures in the device area. The one or more programs also include instructions for using the trained machine-learning model to predict fourth metrology data for the metrology target based on third metrology data for an instance of the device area on a first semiconductor die that is distinct from the semiconductor die having the first plurality of instances of the device area. The one or more programs also include instructions for using a recipe for the metrology target to determine one or more parameters of the metrology target based on the fourth metrology data and for monitoring and controlling the fabrication process based at least in part on the one or more parameters.

In some embodiments, a semiconductor-inspection system includes one or more semiconductor metrology tools, one or more processors, and memory storing one or more programs for execution by the one or more processors. The one or more programs include instructions for using first and second metrology data to train a machine-learning model to predict metrology data for the metrology target based on metrology data for the device area. The first metrology data are for a plurality of instances of a device area on semiconductor die fabricated using a fabrication process. The device area contains semi-periodic or non-periodic structures. The second metrology data are for a plurality of instances of a metrology target. The metrology target contains structures distinct from the semi-periodic or non-periodic structures in the device area. The one or more programs also include instructions for using the trained machine-learning model to predict fourth metrology data for the metrology target based on third metrology data for an instance of the device area on a first semiconductor die that is distinct from the semiconductor die having the first plurality of instances of the device area. The one or more programs also include instructions for using a recipe for the metrology target to determine one or more parameters of the metrology target based on the fourth metrology data and for monitoring and controlling the fabrication process based at least in part on the one or more parameters.

BRIEF DESCRIPTION OF THE DRAWINGS

For a better understanding of the various described implementations, reference should be made to the Detailed Description below, in conjunction with the following drawings.

FIG. 2 shows a flowchart of a method of performing semiconductor metrology using signal-domain adaptation in accordance with some embodiments.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
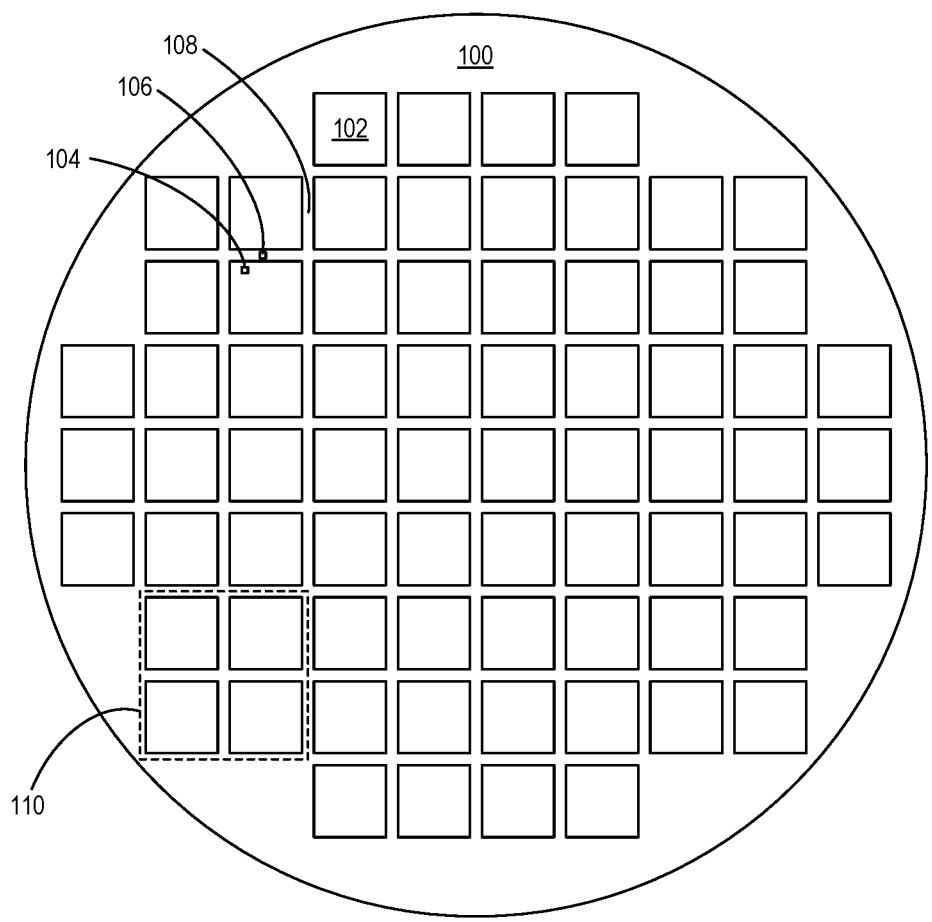
FIG. 1 shows a semiconductor wafer on which a plurality of semiconductor die have been fabricated using a fabrication process, in accordance with some embodiments.

FIG. 1 shows a semiconductor wafer 100 on which a plurality of semiconductor die 102 have been fabricated using a fabrication process, in accordance with some embodiments. In some embodiments, the semiconductor die 102 have been fully fabricated, such that all steps in the fabrication process have been performed. Alternatively, the semiconductor die 102 have only been partially fabricated, such that the fabrication process has been performed up until a given point and then paused so that measurements may be taken of structures on the wafer 100. In either case, the wafer 100 is referred to as a full-loop wafer, because all of the steps in the fabrication process from the beginning up until a certain point (i.e., either the given point at which the fabrication process has been pause or the end of the fabrication process) have been performed. A full-loop wafer differs from a short-loop wafer: for a short-loop wafer, only a portion of the steps in the fabrication process are performed (e.g., steps corresponding to one or more layers, but not to every layer up until a certain point). For example, a short-loop wafer may be fabricated by performing steps starting from some mid-point in the fabrication process instead of from the beginning of the fabrication process.

Each die 102 includes a respective instance of a device area 104 that may be inspected using an appropriate metrology technique. Indeed, a die 102 may have multiple areas of interest that are to be. The following disclosure describes a single device area 104 for simplicity, but may be applied to multiple device areas on a die 102. The wafer 100 also includes instances of a metrology target 106 that may be inspected using an appropriate metrology technique. (For simplicity, only a single instance of the device area 104 and a single instance of the metrology target 106 are shown in FIG. 1.)

In some embodiments, the instances of the metrology target 106 are situated in scribe lines 108 that separate the die 102. The scribe lines run horizontally and vertically (i.e., left-to-right and up-and-down, respectively) on the wafer 100 and are sawed up once fabrication is complete to separate the die 102 for packaging. In one example, an instance of the metrology target 106 may be situated above, below, to the left of, and/or to the right of a respective die 102. In another example, at least one metrology target 106 may be situated in each photolithographic field 110, such that at least one metrology target 106 is situated in the same photolithographic field 110 as a respective die 102. A photolithographic field 110 is the group of die 102 and accompanying scribe lines 108 that are exposed through a reticle in a single photolithographic exposure. More generally, an instance of the metrology target 106 may be situated within a specified distance of a respective instance of the device area 104.

In other embodiments, the instances of the metrology target 106 are situated in respective die 102. For example, a single respective instance of the metrology target 106 may be situated in each die 102 on the wafer 100, or a plurality of instances of the metrology target 106 may be distributed within each die 102 on the wafer 100. Including the metrology target 106 in die 102 increases die size, however, thus reducing wafer yield and increasing the die cost.

The same metrology technique may be used to inspect instances of both the device area 104 and the metrology target 106. Alternatively, instances of the device area 104 may be inspected using a first metrology technique and instances of the metrology target 106 may be inspected using a second metrology technique distinct from the first metrology technique. Examples of metrology techniques used to inspect instances of the device area 104 and/or the metrology target 106 include, without limitation, ellipsometry, reflectometry, critical-dimension small-angle x-ray spectroscopy (CD-SAXS), soft x-ray reflectometry (SXR), scanning-electron microscopy (SEM), and transmission-electron microscopy (TEM).

The structures, or arrangement of structures, in the device area 104 are more complex than the structures, or arrangement of structures, in the metrology target 106. For example, the structures in the metrology target 106 are periodic, while the structures in the device area 104 are semi-periodic or non-periodic. Semi-periodic structures are periodic except for the presence of one or more breaks in the periodicity. For example, semi-periodic structures may be periodic in a first set of layers (e.g., top layers, or underlying layers) but non-periodic in a second set of layers (e.g., underlying layers, or alternatively top layers). In one such example, the device area 104 contains CMOS circuitry under an array (CUA, or CMOS under array), in which the array is periodic and the underlying CMOS circuitry is not. Other examples of semi-periodic structures are possible.

The structures in the metrology target 106 may be modeled, and the resulting model used to extract parameter data for a particular instance of the metrology target 106 from metrology data for that instance of the metrology target 106. The structures in the device area 104, however, may be difficult or impossible to model in this manner, such that accurate parameter data cannot reliably be extracted from metrology data for the device area 104. In this situation, respective instances of the device area 104 still contain information about the variation in the fabrication process (i.e., the process variation) that they experienced during fabrication. Metrology data for the respective instances of the device area 104 thus contain this information, at least approximately, but this information cannot be directly extracted from the metrology data. To obtain this information, signal-domain adaptation is used to convert the metrology data for a particular instance of the device area 104 into metrology data for a hypothetical instance of the metrology target 106. One or more parameters (i.e., parameter values) for the hypothetical instance of the metrology target 106 are then extracted using the model for the metrology target 106. These parameters provide the desired process-variation information for the particular instance of the device area 104.

FIG. 2 shows a flowchart of a method 200 of performing semiconductor metrology using signal-domain adaptation in accordance with some embodiments. The method 200 may be performed in a computer system (e.g., the computer system of the semiconductor-inspection system 400, FIG. 4). Steps in the method 200 may be combined or broken out. The method 200 is described with reference to FIG. 3, which shows the flow of data in the method 200 in accordance with some embodiments. Modules shown in FIG. 3 correspond to instructions stored in the memory of the computer system (e.g., the memory 410, FIG. 4). The method 200 may be performed automatically, without user intervention.

Figure 3:
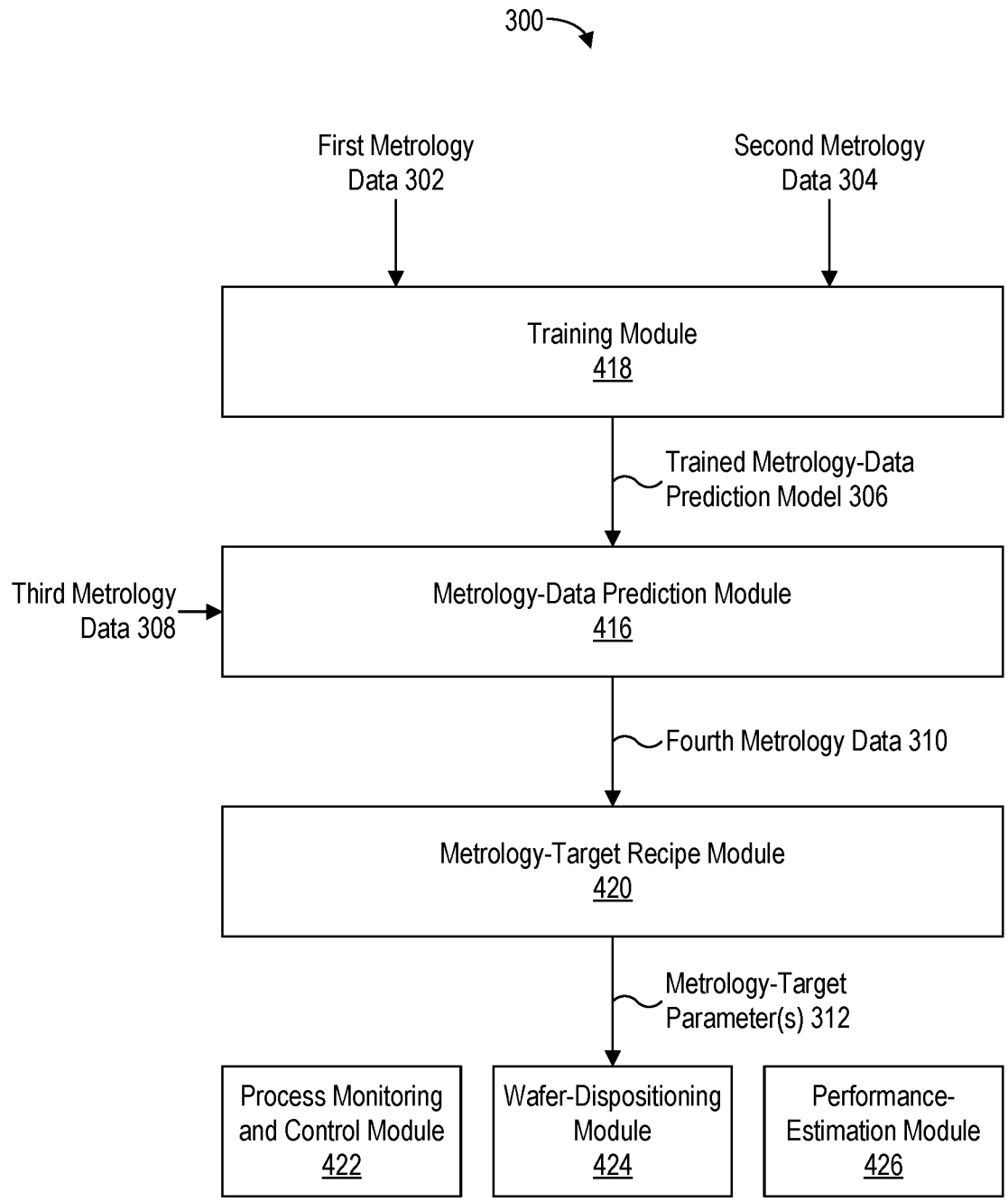
FIG. 3 shows the flow of data in the method of FIG. 2 in accordance with some embodiments.
Figure 4:
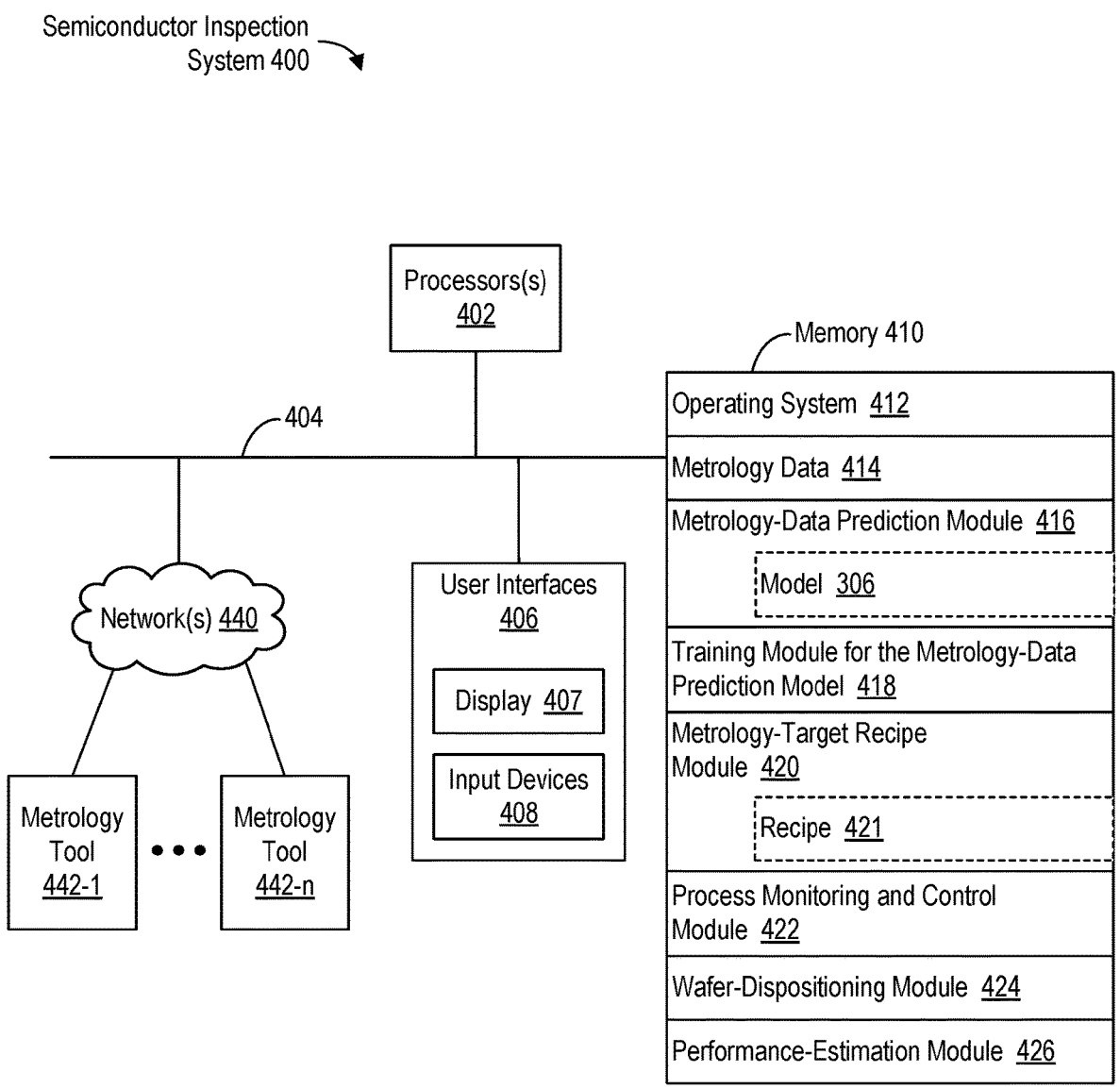
FIG. 4 is a block diagram of a semiconductor-inspection system in accordance with some embodiments.

In the method 200, first metrology data 302 (FIG. 3) is obtained (202) for a plurality of instances of a device area 104 (FIG. 1) on semiconductor die 102 fabricated using a fabrication process. The device area 104 contains semi-periodic or non-periodic structures. Second metrology data 304 is obtained (202) for a plurality of instances of a metrology target 106. The metrology target 106 contains structures distinct from the semi-periodic or non-periodic structures in the device area 104. In some embodiments, the structures contained in the metrology target 106 are (204) periodic. The first metrology data 302 and second metrology data 304 are obtained, directly or indirectly, from one or more metrology tools 442 (FIG. 4).

In some embodiments, obtaining (202) the first metrology data 302 and the second metrology data 304 includes obtaining (206) metrology data for a plurality of paired instances of the device area 104 and the metrology target 106. The plurality of paired instances may be situated on one or more semiconductor wafers 100 (FIG. 1) on which semiconductor die 102 are separated by scribe lines 108. For example, a respective paired instance (e.g., each paired instance) of the plurality of paired instances includes an instance of the device area 104 on a respective semiconductor die 102 and an instance of the metrology target 106 in a respective scribe line 108 adjacent to the respective semiconductor die 102. In another example, the one or more semiconductor wafers 100 are divided into multiple lithographic fields 110, wherein different lithographic fields 110 are fabricated using different conditions for the fabrication process, in accordance with an experimental design (referred to as a design of experiments or DOE). Respective paired instances (e.g., every paired instance) of the plurality of paired instances each include an instance of the device area 104 on a respective semiconductor die 102 in a lithographic field 110 and an instance of the metrology target 106 situated in the same lithographic field 110. In yet another example, respective paired instances (e.g., every paired instance) of the plurality of paired instances each include an instance of the device area 104 on a respective semiconductor die 102 and an instance of the metrology target 106 situated on the same semiconductor die 102. More generally, respective paired instances (e.g., every paired instance) of the plurality of paired instances each include an instance of the device area 104 and an instance of the metrology target 106 situated within a specified distance of each other.

In other embodiments, the plurality of instances of the device area 104 are not paired (208) with the plurality of instances of the metrology target 106. For example, the plurality of instances of the device area 104 may be from a first set of one or more wafers 100 and the plurality of instances of the metrology target 106 may be from a non-overlapping second set of one or more wafers 100.

In some embodiments, the plurality of instances of the device area 104 are situated (210) on one or more full-loop semiconductor wafers 100 fabricated using a series of steps in the fabrication process. The plurality of instances of the metrology target 106 are situated on one or more short-loop semiconductor wafers fabricated using a subset of the series of steps in the fabrication process. The one or more short-loop semiconductor wafers are fabricated under varying process conditions (e.g., with different lithographic fields 110 being fabricated under different process conditions) in accordance with some embodiments. Such embodiments are examples of the plurality of instances of the device area 104 not being paired (208) with the plurality of instances of the metrology target 106.

In some embodiments, the plurality of instances of the device area 104 are situated (212) on one or more semiconductor wafers 100. The plurality of instances of the metrology target 106 are simulated. The second metrology data 304 thus may include simulated metrology data (e.g., be simulated and/or real metrology data). For example, obtaining the second metrology data (or a portion thereof) in step 202 may include performing simulations for a model of the metrology target 106 under varying simulated conditions for the fabrication process. Such embodiments are further examples in which the plurality of instances of the device area 104 are not paired (208) with the plurality of instances of the metrology target 106.

Using the first metrology data 302 and the second metrology data 304, a machine-learning model is trained (214) to predict metrology data for the metrology target 106 based on metrology data for the device area 104. For example, the first metrology data 302 and the second metrology data 304 are provided to a training module 418 (FIG. 3), which trains a metrology-data prediction model 306. In some embodiments, the machine-learning model (e.g., the metrology-data prediction model 306) is a neural network that is trained by adjusting weights at respective nodes within the neural network.

In some embodiments in which the plurality of instances of the device area 104 are paired with the plurality of instances of the metrology target 106, the machine-learning model is trained by adjusting weights to minimize the difference between the second metrology data 304 and metrology data predicted by the model based on the first metrology data 302. For example, if the first metrology data 302 include spectra (e.g., optical spectra) $S_{DA}$ for instances of the device area 104, the machine-learning model implements a function $G(S_{DA})$ that produces predicted metrology data for the metrology target 106, and the second metrology data 304 include spectra (e.g., optical spectra) $S_{MT}$ for instances of the metrology target 106, then weights w for the machine-learning model are determined as:

$$w = \mathrm{argmin} \| G(S_{DA}) - S_{MT} \| \quad (1)$$

The second metrology data 304 thus serves as a ground truth against which the outputs of the machine-learning model are compared during the training process, with the machine-learning model being adjusted accordingly. Because of the proximity between the device area 104 and the metrology target 106 for each paired instance, in accordance with some embodiments, the device area 104 and the metrology target 106 for a respective paired instance experience similar (e.g., approximately equivalent) process variation, making the second metrology data 304 an acceptable source of ground truth.

In some embodiments in which the plurality of instances of the device area 104 are not paired with the plurality of instances of the metrology target 106 (e.g., in accordance with steps 208, 210, and/or 212), the training is performed using a Cycle Generative Adversarial Network (Cycle GAN) technique. Cycle GAN involves two models, a generator and a discriminator, both of which are trained during the training step 202. The generator implements a function G that produces predicted metrology data for the metrology target 106 based on metrology data for the device area 104. During training, the generator receives the first metrology data 302 as input. For example, if the first metrology data 302 include spectra (e.g., optical spectra) $S_{DA}$ for instances of the device area 104, the machine-learning model implements a function $G(S_{DA})$ that produces predicted metrology data for the metrology target 106. The discriminator determines whether metrology data for the metrology target 106 is likely real or fake. During training, the discriminator receives the second metrology data 304 (e.g., $S_{MT}$) as examples of real metrology data for the metrology target 106 (even if the second metrology data 304 is simulated—the word "real" in the context of Cycle GAN is used differently than the word "real" in the context of metrology data), and classifies the output of the generator (e.g., $G(S_{DA})$) as real or fake. Training is complete when the discriminator believes to within a specified degree that the output of the generator is real.

Third metrology data 308 is obtained (216) for an instance of the device area 104 on a first semiconductor die 102 that is distinct from the semiconductor die 102 having the first plurality of instances of the device area 104. In some embodiments, the third metrology data 308 is obtained, directly or indirectly, from a metrology tool 442 (FIG. 4) and is provided to a metrology-data prediction module 416 (FIG. 3). The first semiconductor die 102 may be situated on a wafer 100 that is different from (e.g., is from a different wafer lot than) the one or more wafers 100 that were inspected to generate the first metrology data 302 and the second metrology data 304 (or that were inspected to generate the first metrology data 302, if the second metrology data 304 is simulated). For example, the one or more wafers 100 that were inspected to generate the first metrology data 302 and/or the second metrology data 304 may be experimental wafers (e.g., that implement a process-variation DOE), while the first semiconductor die 102 is situated on a production wafer.

Using the trained machine-learning model, fourth metrology data 310 is predicted (218) for the metrology target 106 (i.e., for a hypothetical instance of the metrology target 106) based on the third metrology data 308. For example, the metrology-data prediction module 416 (FIG. 3) receives the trained metrology-data prediction model 306 from the training module 418 and predicts the fourth metrology data 310 by processing the third metrology data 308 with the trained metrology-data prediction model 306. In some embodiments, if Cycle GAN was used to train the metrology-data prediction model 306, then the trained generator (which is part of the metrology-data prediction model 306) is used to predict the fourth metrology data 310 based on the third metrology data 308.

Using a recipe for the metrology target 106, one or more parameters of the metrology target 106 (i.e., of the hypothetical instance of the metrology target 106 described for step 218) are determined (220) based on the fourth metrology data 310. For example, a metrology-target recipe module 420 (FIG. 3) receives the fourth metrology data 310 and determines the one or more parameters by processing the fourth metrology data 310 using a recipe 421 (FIG. 4). The one or more parameters may include geometric parameters (e.g., critical dimension (CD), overlay, sidewall angle, edge-placement error, etc.) and/or fabrication process parameters (e.g., photolithographic focus photolithographic dose, etc.) In some embodiments, the one or more parameters are selected (222) from the group consisting of CD, overlay, sidewall angle, edge-placement error, photolithographic focus, and photolithographic dose. In some embodiments, the recipe (e.g., recipe 421, FIG. 4) is a model-based recipe. A model-based recipe may be, for example, regression-based. In another example, a model-based recipe may be a machine-learning-based recipe trained from data generated using a model and a simulator. In some other embodiments, the recipe (e.g., recipe 421, FIG. 4) is a model-free (i.e., model-less) recipe trained using real metrology data from wafers and references from a reference metrology tool. In still other embodiments, the recipe (e.g., recipe 421, FIG. 4) may be trained using both simulated metrology data and real metrology data. Such a recipe may be considered model-based, since the simulated metrology data is generated using the model and simulator.

The fabrication process is monitored and controlled (224) based at least in part on the one or more parameters as determined in step 220. In some embodiments, this monitoring and controlling is performed by a process monitoring and control module 422 (FIG. 3). For example, if all or a portion of the one or more parameters differ from respective target values by an amount that satisfies (e.g., exceeds, or equals or exceeds) a threshold, the fabrication process is adjusted so that values for die 102 on future wafers 100 will be within range of the target values (e.g., will not satisfy the threshold difference). In another example, the one or more parameters may be provided as input for a statistical process control (SPC) procedure, and one or more fabrication-process parameters may be adjusted based on SPC results.

Alternatively or in addition to performing step 224, the method 200 may include dispositioning a semiconductor wafer 100 on which the first semiconductor die 102 is situated, based at least in part on the one or more parameters as determined in step 220. Dispositioning the semiconductor wafer 100 may include selecting between continuing to process the wafer 100, reworking the wafer 100, or scrapping the wafer 100. Dispositioning may be performed by a wafer-dispositioning module 424 (FIG. 3).

Alternatively or in addition to performing step 224 and/or performing the dispositioning, the method 200 may include estimating performance (e.g., speed and/or power consumption) of the first semiconductor die 102 based at least in part on the one or more parameters as determined in step 220. This estimation may be performed by a performance-estimation module 426 (FIG. 3).

The first metrology data 302, second metrology data 304, third metrology data 308, and fourth metrology data 310 may include, without limitation, metrology data for any of the types of metrology described with respect to FIG. 1. For example, the first metrology data 302, the second metrology data 304, the third metrology data 308, and the fourth metrology data 310 may include the same type of metrology data, with the second metrology data 304 being real and/or simulated and the fourth metrology data 310 being predicted data generated in step 218. In one such example, the first metrology data 302, second metrology data 304, third metrology data 308, and fourth metrology data 310 each include data for optical spectra (e.g., ellipsometry data or reflectometry data). Alternatively, the first metrology data 302 and the third metrology data 308 each include a first type of metrology data, while the second metrology data 304 and the fourth metrology data 310 each include a second type of metrology data distinct from the first type of metrology data. In one such example, the first metrology data 302 and the third metrology data 308 each include data for optical spectra (e.g., ellipsometry data or reflectometry data), while the second metrology data 304 and the fourth metrology data 310 each include SEM data (or vice-versa). Numerous other examples are possible.

FIG. 4 is a block diagram of a semiconductor-inspection system 400 in accordance with some embodiments. The semiconductor-inspection system 400 includes one or more semiconductor metrology tools 442-1 through 442-n (where n is an integer greater than or equal to one) and a computer system with one or more processors 402 (e.g., CPUs and/or GPUs), user interfaces 406, memory 410, and one or more communication buses 404 interconnecting these components. The computer system may be communicatively coupled with the one or more semiconductor metrology tools 442 through one or more wired and/or wireless networks 440. The computer system may further include one or more network interfaces (wired and/or wireless, not shown) for communicating with the one or more semiconductor metrology tools 442 and/or remote computer systems. Examples of the one or more semiconductor metrology tools 442 include, without limitation, an ellipsometer, reflectometer, CD-SAXS tool, SXR tool, SEM (e.g., CD-SEM), or TEM. In some embodiments, a semiconductor metrology tool 442 may be configured to perform multiple types of metrology. In some embodiments, the semiconductor metrology tools 442 may include metrology tools of different types (e.g., an ellipsometer and a SEM, etc.).

The user interfaces 406 may include a display 407 and one or more input devices 408 (e.g., a keyboard, mouse, touch-sensitive surface of the display 407, etc.). The display 407 may report results of the method 200 (FIG. 2). For example, the display 407 may display the one or more parameters determined in step 220, an image of the metrology target 106 generated in accordance with the one or more parameters, results of the monitoring of step 224, adjustments to the fabrication process made or to be made per the process control of step 224, wafer-dispositioning results determined by the wafer-dispositioning module 424 (FIG. 3), and/or device-performance estimates determined by the performance-estimation module 426 (FIG. 3).

Memory 410 includes volatile and/or non-volatile memory. Memory 410 (e.g., the non-volatile memory within memory 410) includes a non-transitory computer-readable storage medium. Memory 410 optionally includes one or more storage devices remotely located from the processors 402 and/or a non-transitory computer-readable storage medium that is removably inserted into the computer system. In some embodiments, memory 410 (e.g., the non-transitory computer-readable storage medium of memory 410) stores the following modules and data, or a subset or superset thereof: an operating system 412 that includes procedures for handling various basic system services and for performing hardware-dependent tasks, metrology data 414 (e.g., first metrology data 302, second metrology data 304, third metrology data 308, and fourth metrology data 310), the metrology-data prediction module 416 (FIG. 3), the training module 418 (FIG. 3), the metrology-target recipe module 420 (FIG. 3), the process monitoring and control module 422 (FIG. 3), the wafer-dispositioning module 424 (FIG. 3), and the performance-estimation module 426. The metrology-data prediction module 416 includes the metrology-data prediction model 306 (FIG. 3). The metrology-target recipe module 420 includes a recipe 421.

The memory 410 (e.g., the non-transitory computer-readable storage medium of the memory 410) thus includes instructions for performing all or a portion of the method 200 (FIG. 2) and for implementing the data flow of FIG. 3. Each of the modules stored in the memory 410 corresponds to a set of instructions for performing one or more functions described herein. Separate modules need not be implemented as separate software programs. The modules and various subsets of the modules may be combined or otherwise re-arranged. In some embodiments, the memory 410 stores a subset or superset of the modules and/or data structures identified above.

FIG. 4 is intended more as a functional description of the various features that may be present in a semiconductor-inspection system than as a structural schematic. For example, the functionality of the computer system in the semiconductor-inspection system 400 may be split between multiple devices. A portion of the modules stored in the memory 410 may alternatively be stored in one or more other computer systems communicatively coupled with the computer system of the semiconductor-inspection system 400 through one or more networks.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method of performing semiconductor metrology, comprising,
in a computer system comprising one or more processors and memory storing instructions for execution by the one or more processors:
obtaining first metrology data for a plurality of instances of a device area on semiconductor die fabricated using a fabrication process, the device area containing semi-periodic or non-periodic structures;
obtaining second metrology data for a plurality of instances of a metrology target, wherein the metrology target contains structures distinct from the semi-periodic or non-periodic structures in the device area;
using the first and second metrology data, training a machine-learning model to predict metrology data for the metrology target based on metrology data for the device area;
obtaining third metrology data for an instance of the device area on a first semiconductor die that is distinct from the semiconductor die having the first plurality of instances of the device area;
using the trained machine-learning model, predicting fourth metrology data for the metrology target based on the third metrology data;
using a recipe for the metrology target, determining one or more parameters of the metrology target based on the fourth metrology data; and
monitoring and controlling the fabrication process based at least in part on the one or more parameters.

2. The method of claim 1, wherein the structures contained in the metrology target are periodic.

3. The method of claim 1, wherein obtaining the first and second metrology data comprises obtaining metrology data for a plurality of paired instances of the device area and the metrology target.

4. The method of claim 3, wherein:
the plurality of paired instances are situated on one or more semiconductor wafers on which semiconductor die are separated by scribe lines; and a respective paired instance of the plurality of paired instances comprises an instance of the device area on a respective semiconductor die and an instance of the metrology target in a respective scribe line adjacent to the respective semiconductor die.

5. The method of claim 3, wherein:
the plurality of paired instances comprise paired instances of the device area and the metrology target situated on a semiconductor wafer;
the semiconductor wafer is divided into multiple lithographic fields, wherein different lithographic fields are fabricated using different conditions for the fabrication process, in accordance with a design of experiments (DOE); and
respective paired instances of the plurality of paired instances each comprise an instance of the device area on a respective semiconductor die in a lithographic field and an instance of the metrology target situated in the same lithographic field as the respective semiconductor die.

6. The method of claim 1, wherein:
the plurality of instances of the device area are not paired with the plurality of instances of the metrology target; and
training the machine-learning model comprises using a Cycle Generative Adversarial Network (Cycle GAN) technique.

7. The method of claim 1, wherein:
the plurality of instances of the device area are situated on one or more full-loop semiconductor wafers fabricated using a series of steps in the fabrication process; and
the plurality of instances of the metrology target are situated on one or more short-loop semiconductor wafers fabricated using a subset of the series of steps in the fabrication process.

8. The method of claim 1, wherein:
the plurality of instances of the device area are situated on one or more semiconductor wafers; and
the plurality of instances of the metrology target are simulated, wherein obtaining the second metrology data comprises performing simulations for a model of the metrology target under varying simulated conditions for the fabrication process.

9. The method of claim 1, wherein the first metrology data, the second metrology data, the third metrology data, and the fourth metrology data each comprise metrology data selected from the group consisting of ellipsometry data, reflectometry data, critical-dimension small-angle x-ray spectroscopy (CD-SAXS) diffraction data, soft x-ray reflectometry (SXR) diffraction data, scanning-electron microscopy (SEM) data, and transmission-electron microscopy (TEM) data.

10. The method of claim 9, wherein the first metrology data, the second metrology data, the third metrology data, and the fourth metrology data comprise the same type of metrology data.

11. The method of claim 10, wherein the first metrology data, the second metrology data, the third metrology data, and the fourth metrology data each comprise data for optical spectra.

12. The method of claim 9, wherein:
the first metrology data and the third metrology data each comprise a first type of metrology data; and
the second metrology data and the fourth metrology data each comprise a second type of metrology data distinct from the first type of metrology data.

13. The method of claim 12, wherein:
the first metrology data and the third metrology data each comprise data for optical spectra; and
the second metrology data and the fourth metrology data each comprise SEM data.

14. The method of claim 12, wherein:
the first metrology data and the third metrology data each comprise SEM data; and
the second metrology data and the fourth metrology data each comprise data for optical spectra.

15. The method of claim 1, wherein the one or more parameters are selected from the group consisting of critical dimension (CD), overlay, sidewall angle, edge-placement error, photolithographic focus, and photolithographic dose.

16. A non-transitory computer-readable storage medium storing one or more programs for execution by one or more processors of a computer system, the one or more programs comprising instructions for:
using first and second metrology data, training a machine-learning model to predict metrology data for the metrology target based on metrology data for the device area, wherein:
the first metrology data are for a plurality of instances of a device area on semiconductor die fabricated using a fabrication process, the device area containing semi-periodic or non-periodic structures; and
the second metrology data are for a plurality of instances of a metrology target, the metrology target containing structures distinct from the semi-periodic or non-periodic structures in the device area;
using the trained machine-learning model, predicting fourth metrology data for the metrology target based on third metrology data for an instance of the device area on a first semiconductor die that is distinct from the semiconductor die having the first plurality of instances of the device area;
using a recipe for the metrology target, determining one or more parameters of the metrology target based on the fourth metrology data; and
monitoring and controlling the fabrication process based at least in part on the one or more parameters.

17. The computer-readable storage medium of claim 16, wherein the structures contained in the metrology target are periodic.

18. The computer-readable storage medium of claim 16, wherein:
the plurality of instances of the device area are situated on one or more full-loop semiconductor wafers fabricated using a series of steps in the fabrication process; and
the plurality of instances of the metrology target are situated on one or more short-loop semiconductor wafers fabricated using a subset of the series of steps in the fabrication process.

19. The computer-readable storage medium of claim 16, wherein:
the plurality of instances of the device area are situated on one or more semiconductor wafers;
the plurality of instances of the metrology target are simulated; and
the one or more programs further comprise instructions for performing simulations for a model of the metrology target under varying simulated conditions for the fabrication process, to generate the plurality of instances of the metrology target.

20. The computer-readable storage medium of claim 16, wherein:
the first metrology data and the third metrology data each comprise a first type of metrology data; and the second metrology data and the fourth metrology data each comprise a second type of metrology data distinct from the first type of metrology data.

21. A semiconductor-inspection system, comprising:
one or more semiconductor metrology tools;
one or more processors; and
memory storing one or more programs for execution by the one or more processors, the one or more programs comprising instructions for:
  using first and second metrology data, training a machine-learning model to predict metrology data for the metrology target based on metrology data for the device area, wherein:
    the first metrology data are for a plurality of instances of a device area on semiconductor die fabricated using a fabrication process, the device area containing semi-periodic or non-periodic structures; and
    the second metrology data are for a plurality of instances of a metrology target, the metrology target containing structures distinct from the semi-periodic or non-periodic structures in the device area;
  using the trained machine-learning model, predicting fourth metrology data for the metrology target based on third metrology data for an instance of the device area on a first semiconductor die that is distinct from the semiconductor die having the first plurality of instances of the device area;
  using a recipe for the metrology target, determining one or more parameters of the metrology target based on the fourth metrology data; and
  monitoring and controlling the fabrication process based at least in part on the one or more parameters.

22. The semiconductor-inspection system of claim 21, wherein the structures contained in the metrology target are periodic.

23. The semiconductor-inspection system of claim 21, wherein:
  the plurality of instances of the device area are situated on one or more full-loop semiconductor wafers fabricated using a series of steps in the fabrication process; and
  the plurality of instances of the metrology target are situated on one or more short-loop semiconductor wafers fabricated using a subset of the series of steps in the fabrication process.

24. The semiconductor-inspection system of claim 21, wherein:
  the plurality of instances of the device area are situated on one or more semiconductor wafers;
  the plurality of instances of the metrology target are simulated; and
  the one or more programs further comprise instructions for performing simulations for a model of the metrology target under varying simulated conditions for the fabrication process, to generate the plurality of instances of the metrology target.

25. The semiconductor-inspection system of claim 21, wherein:
  the first metrology data and the third metrology data each comprise a first type of metrology data; and
  the second metrology data and the fourth metrology data each comprise a second type of metrology data distinct from the first type of metrology data.

* * * * *